United States Patent
Taninaka et al.

(10) Patent No.: US 6,621,105 B2
(45) Date of Patent: Sep. 16, 2003

(54) ARRAY OF LIGHT-EMITTING ELEMENTS WITH MULTILAYER WIRING

(75) Inventors: Masumi Taninaka, Hachioji (JP); Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/123,354

(22) Filed: Apr. 16, 2002

(65) Prior Publication Data

US 2002/0153846 A1 Oct. 24, 2002

(30) Foreign Application Priority Data

Apr. 18, 2001 (JP) ........................................ 2001-119581

(51) Int. Cl.[7] .............................................. H01L 33/00
(52) U.S. Cl. .............................. 257/88; 257/84; 257/93
(58) Field of Search ................................. 257/88, 81, 84, 257/93, 99, 91; 315/169.3, 169.4

(56) References Cited

U.S. PATENT DOCUMENTS 5,990,494 A * 11/1999 Seko et al. .................... 257/88

OTHER PUBLICATIONS

"LED Purinta no Sekkei" (LED Printer Design), *Trikeppusu KK*, pp. 60–63, (Aug. 31, 1987).

* cited by examiner

*Primary Examiner*—David Vu
(74) *Attorney, Agent, or Firm*—Akin Gump Strauss Hauer & Feld, L.L.P.

(57) ABSTRACT

An array of light-emitting elements is divided into cells, the cells are divided into electrically isolated blocks, and a multilayer wiring scheme is employed in which each block has two wire-bonding pads. A first wire leads from the first wire-bonding pad to one of the light-emitting elements in the block. A second wire leads from the second wire-bonding pad to an electrode disposed adjacent to the light-emitting elements in the block, preferably leading to a point near the middle of this electrode. The relative positions of the first and second bonding pads are varied so that the first wire can reach light-emitting elements in different positions in different blocks without crossing the second wire in any block.

15 Claims, 14 Drawing Sheets

ARRAY OF LIGHT-EMITTING ELEMENTS WITH MULTILAYER WIRING

BACKGROUND OF THE INVENTION

1. Field of the Invention

The present invention relates to an array of light-emitting elements having a multilevel wiring structure.

2. Description of the Related Art

The term 'array of light-emitting elements' refers herein to a device in which a plurality of light-emitting elements are aligned in a row. If the light-emitting elements are light-emitting diodes (LEDs), the device is termed an LED array. LED arrays are used as exposure light sources in, for example, electrophotographic printers.

LED arrays are disclosed in, for example, the book *LED Purinta no Sekkei* ('Design of LED printers,' Triceps). FIGS. 17 and 18, taken therefrom, show a sectional view and a top plan view of a conventional LED array.

In the LED array shown in FIGS. 17 and 18, an n-type gallium arsenide phosphide ($GaAs_{0.6}P_{0.4}$) layer 2 is formed on an n-type gallium arsenide (GaAs) substrate 1, and a p-type impurity such as zinc (Zn) is selectively diffused to form an array of light-emitting regions 3. Each light-emitting region 3 has an individual aluminum (Al) electrode 4, and all of the light-emitting regions 3 share a common gold-germanium-nickel (Au—Ge—Ni) electrode 5. The gold-germanium-nickel electrode 5 is formed on and electrically connected to the underside of the n-type GaAs substrate 1. The aluminum electrodes 4 are formed on a dielectric layer 6 and are electrically connected to respective light-emitting regions 3. Each aluminum electrode 4 is also electrically connected to a wire-bonding pad, referred to below as an electrode pad 7.

FIG. 19 shows one cell in a conventional type of LED array with multilayer wiring. FIG. 20 shows an enlarged view of the part A in FIG. 19. The cell structure shown in 19 was recently proposed by the present inventors with the major purpose of reducing the number of the electrode pads. Further purposes included lowering the forward voltage of the light-emitting elements, lowering the power consumption, reducing the size of the LED array, and thereby reducing its manufacturing cost.

As shown in FIG. 19, an LED array of the multilayer-wiring type comprises p-wires 32 electrically connected to the LEDs (light-emitting elements) 20, and common wires 60 that interconnect the p-wires 32 so that they are all electrically connected to one or another of the p-electrode pads 33. The p-wires 32 and common wires 60 are disposed in separate wiring layers separated by an inter-layer dielectric film 50. The p-wires 32 and common wires 60 are perpendicular to each other, and the semiconductor layer 12 including the LEDs 20 is divided into a plurality of mutually isolated blocks 10.

An LED array of this multilayer-wiring type can be manufactured by, for example, the following method. First, an n-type semiconductor layer 12 is formed on a high-resistance substrate 11. Next, isolation trenches 13 are formed, dividing the semiconductor layer 12 into M electrically isolated blocks 10. Then a p-type impurity is selectively diffused through a diffusion mask 21 to form N p-type semiconductor regions in each block. Each of these N p-type semiconductor regions becomes an LED. (M and N are integers greater than unity.)

Next, p-electrodes 31, p-wires 32, and p-electrode pads 33 are formed. In each block 10, the p-electrodes 31 and p-wires 32 are in one-to-one correspondence to the N LEDs 20, the p-electrodes 31 forming the ends of the p-wires 32 that contact the LEDs 20. Each block 10 has one p-electrode pad 33, connected to one of the p-wires 32 in the block. After an inter-layer dielectric film (not shown) has been deposited, and this film and the diffusion mask 21 have been patterned, one n-electrode 41 is formed in each block 10, making electrical contact with the n-type semiconductor layer 12. Then one n-wire 42 and one n-electrode pad 43 are formed in each block 10, the n-wire 42 connecting the n-electrode pad 43 to the n-electrode 41. The p-electrode pads 33 and n-electrode pads 43 are used for wire bonding.

Next, an inter-layer dielectric film 50 is deposited and patterned to form openings 51 in which the p-wires 32 are partly exposed. N common wires 60 per cell are then formed, extending across all blocks in the cell and connected to the p-wires 32 through the openings 51. Each common wire 60 is connected to one p-wire 32 of each block 10.

In an LED array with this multilayer wiring structure, the n-electrodes 41 are formed near to LEDs 20 in order to diminish the voltage drop caused by the resistance component of the high-resistance substrate 11. This enables the forward voltage supplied to the LEDs to be reduced, so that power consumption is reduced. In addition, placing the p-electrode pads 33 and n-electrode pads 43 on the same side of the cell reduces the cell size, thereby reducing the manufacturing cost.

In a conventional multilayer-wiring LED array, however, the p-electrode pads 33 and n-electrode pads 43 are disposed alternately. As a result, in the right half of the cell in FIG. 20, the p-wires 32 connected to the p-electrode pads 33 cross the n-wires 42 connected to the n-electrode pads 43. These crossings are potential sites of wiring defects. Another problem is that the crossed wires cannot be formed by patterning the same conductive film, and cannot be formed in the same manufacturing process step. A further problem is that an extra dielectric film is required to insulate the crossed p-wires and n-wire from each other; that is, the p-wires and n-wires must be disposed in separate wiring layers.

SUMMARY OF THE INVENTION

An object of the present invention is to reduce the occurrence of wiring defects in an array of light-emitting elements having multilayer wiring.

Another object of the invention is to enable all electrode pads and their connected wiring to be made from the same material in the same step in the manufacturing process.

Another object is to reduce the number of wiring layers in an array of light-emitting elements having multilayer wiring.

The invented array of light-emitting elements is divided into electrically isolated blocks linked by common wiring. Each block includes a row of light-emitting elements, an electrode disposed adjacent and parallel to the row of light-emitting elements, a first pad for attachment of a bonding wire, a first wire electrically connecting the first pad to one of the light-emitting elements in the block, a second pad for attachment of another bonding wire, and a second wire electrically connecting the second pad to the above-mentioned electrode, preferably at the middle of the electrode. The rows of light-emitting elements in the blocks are mutually aligned to form a single row of light-emitting elements.

The relative positions of the first and second pads and wires vary among the blocks. Specifically, the blocks are divided into a first group in which the first pad and first wire are disposed to one side of the second pad and second wire, and a second group in which the first pad and first wire are disposed to the other side of the second pad and second wire. This arrangement enables the first wires to connect the first pads to light-emitting elements in different positions in different blocks without crossing the second wires.

The lack of such crossings reduces the opportunity for wiring defects to occur, and enables the first pad, first wire, second pad, and second wire in each block to be disposed in a single wiring layer. The first pad, first wire, second pad, and second wire can also be made of the same material, in the same manufacturing process step.

The array may be divided into cells, each comprising a plurality of blocks with varying pad and wire arrangements as described above. In this case the common wiring includes common wires interconnecting blocks in the same cell; blocks in different cells are not interconnected. The first wire in each block in the cell is electrically connected to one of the common wires. Each block also includes further wires, formed in the same layer as the first wire, connected to other common wires and to other light-emitting elements in the block.

DETAILED DESCRIPTION OF THE INVENTION

Figure 1:
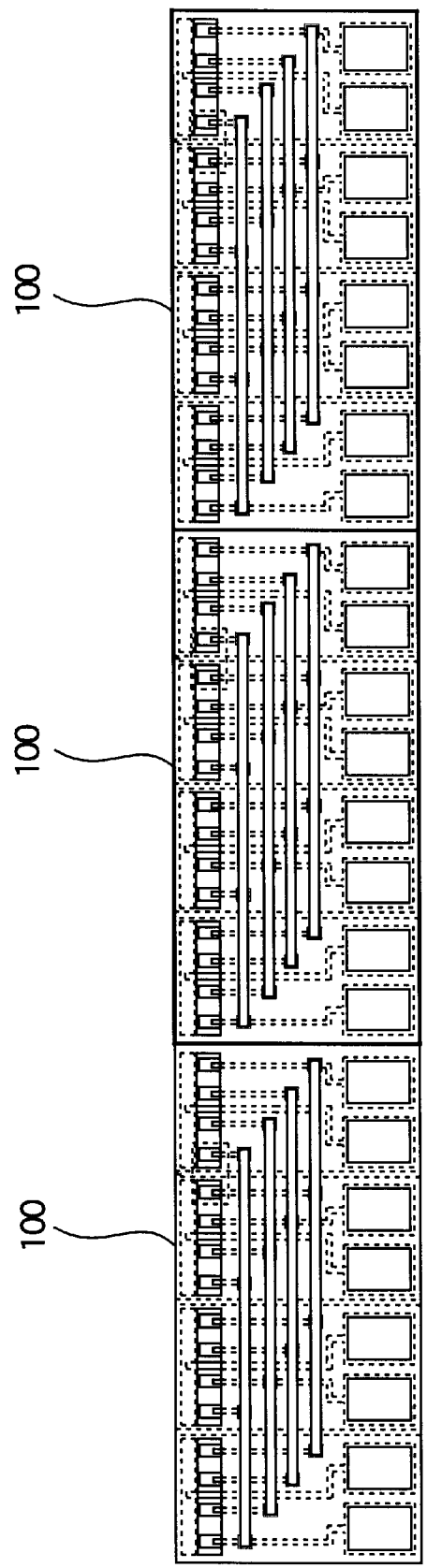
FIG. 1 is a conceptual plan view of an LED array illustrating a first embodiment of the present invention.

Two embodiments of the invention will now be described with reference to the attached drawings, in which like elements are indicated by like reference characters. Both embodiments are LED arrays with multilayer wiring.

Semiconductor layers and regions will be described as being of the first conductive type or the second conductive type. In both embodiments, the first conductive type is p-type and the second conductive type is n-type, but the invention can also be practiced in an array in which the first conductive type is n-type and the second conductive type is p-type. Further variations are possible with respect to the materials and composition of the substrate, electrodes, and wiring, and the impurity material.

The invention is not limited to LED arrays, but can also be practiced in arrays of other types of light-emitting elements, such as an array of semiconductor lasers, and in other semiconductor devices, such as a driver integrated circuit.

First Embodiment

Figure 2:
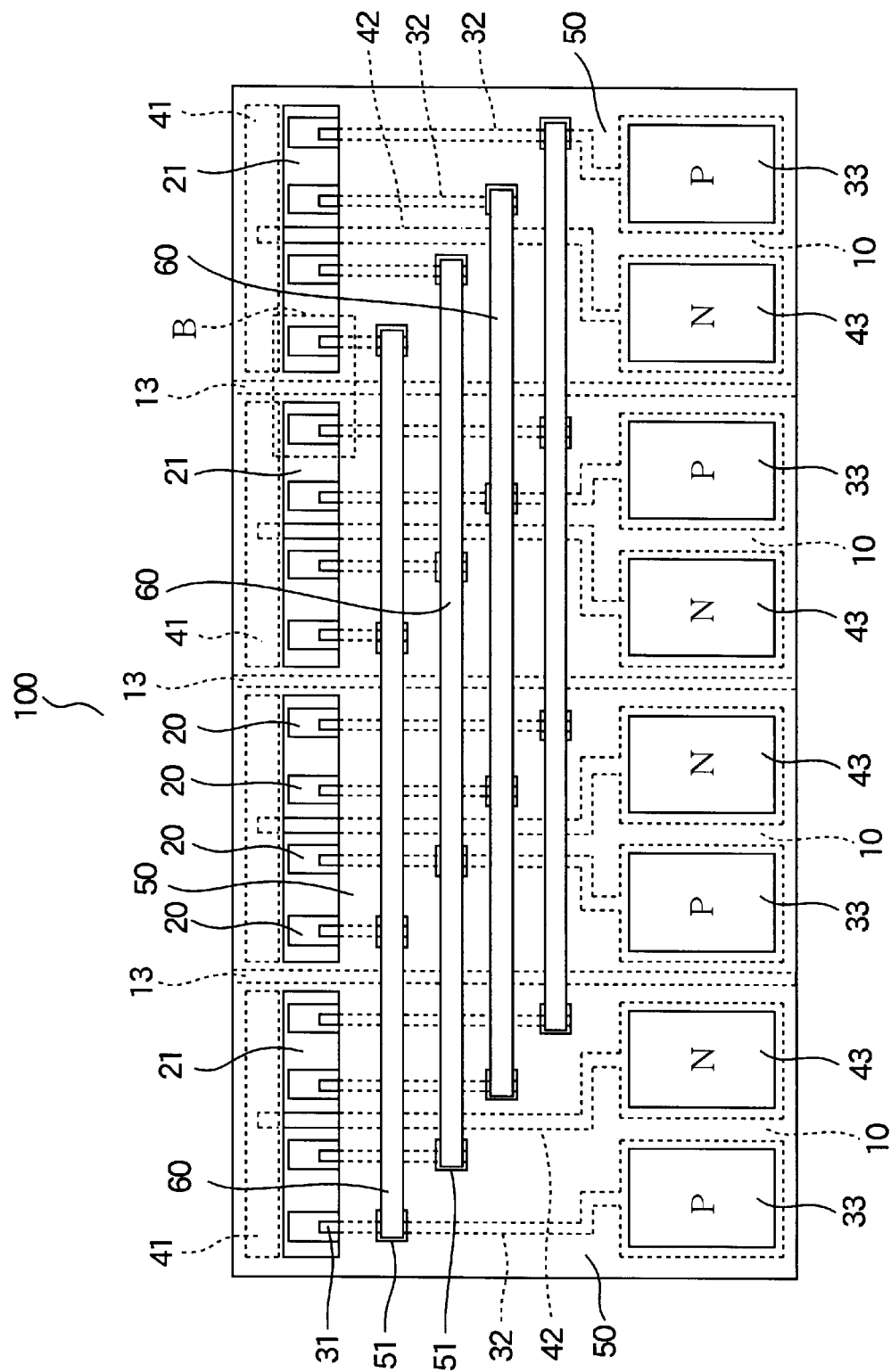
FIG. 2 shows the structure of a cell in FIG. 1.
Figure 3:
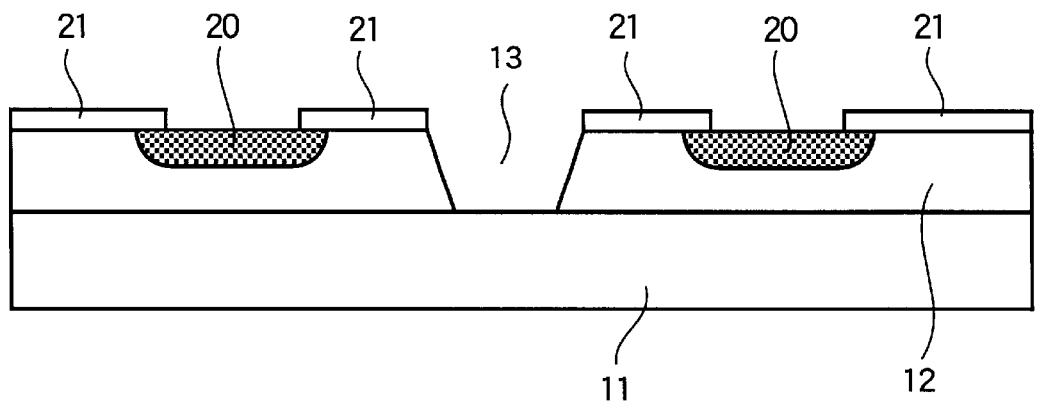
FIG. 3 shows a sectional view of part B in FIG. 2.

FIG. 1 is a conceptual drawing illustrating the first embodiment of the invention. FIG. 2 shows one of the cells in FIG. 1. FIG. 3 is a sectional view of part B in FIG. 2.

As shown in FIG. 1, the LED array is a linear array divided into cells 100. The array is also referred to as a chip.

As shown in FIGS. 2 and 3, the LED array comprises a high-resistance substrate 11 on which a semiconductor layer 12 of the second conductive type is formed. A semi-insulating GaAs substrate, for example, can be used as the high-resistance substrate 11, and an n-type aluminum gallium arsenide (AlGaAs) layer, for example, can be formed by epitaxial growth as the semiconductor layer 12 of the second conductive type. The cell is divided into M blocks by isolation trenches 13 formed by etching.

Each block 10 has N LEDs 20. An LED 20 is a semiconductor region of the first conductive type formed by the diffusion of an impurity material into the second-conductive-type semiconductor layer 12 through a diffusion mask 21, thereby creating a pn junction from which light is emitted when current is supplied. Zinc (Zn), for example, may be used as the impurity material. The N LEDs 20 are disposed in a single row paralleling one side of the cell 100, extending in the longitudinal direction of the cell 100.

M and N are integers greater than one. In FIGS. 2 and 3, M and N are both equal to four, but the invention may be practiced with other values of M and N.

Each block 10 has a row of N p-electrodes 31 electrically connected to the N LEDs 20, N p-wires 32 electrically connected to respective p-electrodes 31, and one p-electrode pad 33 electrically connected to one of the N p-wires 32. The p-electrodes 31, p-wires 32, and p-electrode pads 33 are formed on the diffusion mask 21, which insulates them from the second-conductive-type semiconductor layer 12.

The N p-electrodes 31 are electrically connected to respective LEDs 20 through the diffusion windows in the diffusion mask 21. The N p-wires 32 extend from the p-electrodes 31 toward the opposite side of the cell 100, in the direction perpendicular to the longitudinal direction. The p-electrode pad 33 is disposed near the aforesaid opposite side of the cell 100.

The p-electrodes 31, p-wires 32, and p-electrode pads 33 can be formed from the same material, such as a multilayer gold (Au) film, in a single process, so that they are integrally joined. Alternatively, the p-electrode pads 33 may be formed by a separate process from the p-electrodes 31 and p-wires 32.

Each block 10 has one n-electrode 41, an n-wire 42 electrically connected to the n-electrode 41, and an n-electrode pad 43 electrically connected to the n-wire 42. The n-electrode 41 is disposed between the row of LEDs 20 and the adjacent side of the cell 100, parallel to the row of LEDs 20, and is adjacent to all N LEDs 20 in each block. The n-electrode pads 43 are placed near the opposite side of the cell 100, so that the n-electrode pads 43 and p-electrode pads 33 form a single row parallel to that side of the cell 100. The n-wire 42 extends across the cell 100 in a direction perpendicular to the longitudinal direction, electrically connecting the n-electrode 41 to the n-electrode pad 43.

A gold alloy film, for example, can be used for the n-electrodes 41. As will be described below, the n-wires 42 and n-electrode pads 43 can be formed from the same material as the plurality of p-electrodes 31, p-wires 32, and p-electrode pads 33, in a single process. The n-wires 42 and n-electrode pads 43 can be integrally joined.

Current is supplied to the N LEDs 20 in a block 10 through the p-electrodes 31, and returns through the high-resistance substrate 11 and second-conductive-type semiconductor layer 12 to the n-electrode 41. The adjacency of the n-electrode 41 to the plurality of LEDs 20 reduces the voltage drop caused by the resistive component of the high-resistance substrate 11. Therefore, the forward voltage that must be applied between the p-electrode pads 33 and n-electrode pads 43 to produce the current can be reduced, thus reducing power consumption. Furthermore, the chip size and thus the manufacturing cost are reduced by placing the p-electrode pads 33 and n-electrode pads 43 on the same side of cell 100.

Preferably, the n-wire 42 in each block 10 is connected to the center of the n-electrode 41, so that the N LEDs 20 are equally distributed on both sides of the point of connection. This arrangement minimizes the difference in length of the electrical path from each of the N LEDs 20 to the n-wire 42, thus minimizing current differences and giving the LEDs a more uniform light-emitting energy (brightness) characteristic.

The arrangement of the M p-electrode pads 33 and M n-electrode pads 43 in each cell 100 is mirror-symmetric with respect to the center of the cell 100. The p-electrode pads 33 alternate with the n-electrode pads 43 from the center toward each end of the cell. Consequently, the p-wires 32 on the left side of the cell 100 can reach LEDs 20 on the left side of each block 10, and the p-wires 32 on the right side of the cell 100 can reach LEDs 20 on the right side of each block 10, without crossing any of the n-wires 42. The p-electrodes 31, p-wires 32, p-electrode pads 33, n-wires 42, and n-electrode pads 43 can therefore be formed from the same material in a single process, in a single wiring layer.

The p-electrodes 31, p-wires 32, p-electrode pads 33, n-wires 42, and n-electrode pads 43 are covered by an inter-layer dielectric film 50 made of polyimide resin, for example. Each cell 100 has N common wires 60 (the same number as the number of LEDs 20 in a block 10) formed on the inter-layer dielectric film 50, extending in the longitudinal direction of the cell 100 across the M blocks 10. A multilayer gold film, for example, can be deposited and patterned to form the common wires 60.

The inter-layer dielectric film 50 has contact holes 51 through which electrical connections are made between the common wires 60 and p-wires 32. The contact holes 51 are disposed at suitable intersections of the N common wires 60 and M p-wires 32.

Each common wire 60 passes over just M contact holes 51, one in each block 10. In one of the M blocks 10, the p-wire 32 below the contact hole 51 electrically connects the common wire 60 to both a p-electrode 31 and the p-electrode pad 33, thus to both the p-electrode pad 33 and one of the LEDs 20. In the other blocks 10, the p-wire 32 below the contact hole 51 connects the common wire 60 only to a p-electrode 31 (and an LED 20). This arrangement reduces the number of contact holes 51, as compared to an arrangement wherein the common wire 60 is electrically connected to the p-electrode pad 33 through one contact hole and to the p-electrodes 31 and LEDs 20 through other contact holes. The reduced number of contact holes 51 leads to improved manufacturing yields.

FIGS. 4 to 14 illustrate a manufacturing process for the LED array. FIGS. 4 to 9 show sectional views of a cell 100; FIGS. 10 to 14 show top plan views of the same.

Figure 4:
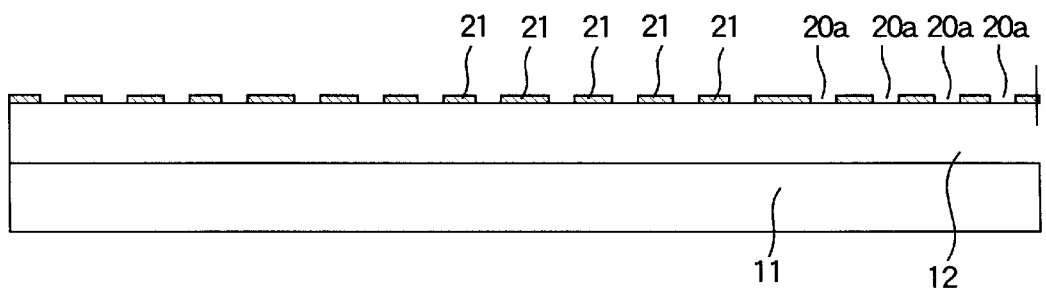
FIG. 4 shows the formation of a diffusion mask.

As shown in FIG. 4, the second-conductive-type semiconductor layer 12 is formed on the high-resistance substrate 11; then a diffusion mask 21 is formed on the semiconductor layer 12. The diffusion mask 21 has openings 20a in the regions in which the LEDs 20 will be formed. A dielectric film such as a silicon nitride (SiN) film formed by chemical vapor deposition (CVD), for example, is used as the diffusion mask 21. The openings 20a can be created by photolithography and etching.

Figure 5:
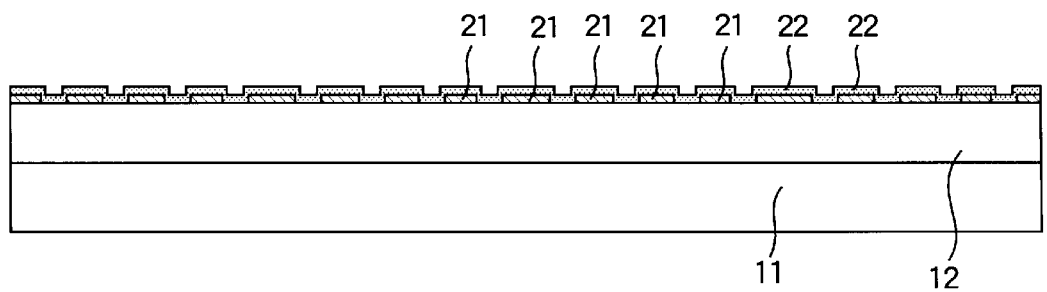
FIG. 5 shows the formation of a diffusion source film.

Next, as shown in FIG. 5, a diffusion source film 22 is formed on the diffusion mask 21 and openings 20a. A film of zinc oxide and silicon dioxide ($ZnO$—$SiO_2$), for example, can be used as the diffusion source film 22. The $ZnO$—$SiO_2$ film can be deposited by sputtering, for example.

Figure 6:
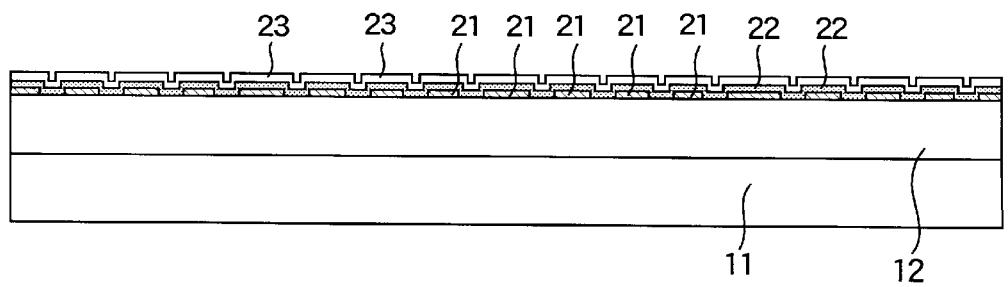
FIG. 6 shows the formation of a anneal cap.

Next, as shown in FIG. 6, an anneal cap 23 is formed on the diffusion source film 22. An aluminum nitride (AlN) film, for example, can be used for the anneal cap 23. The AlN film can be deposited by sputtering, for example.

Figure 7:
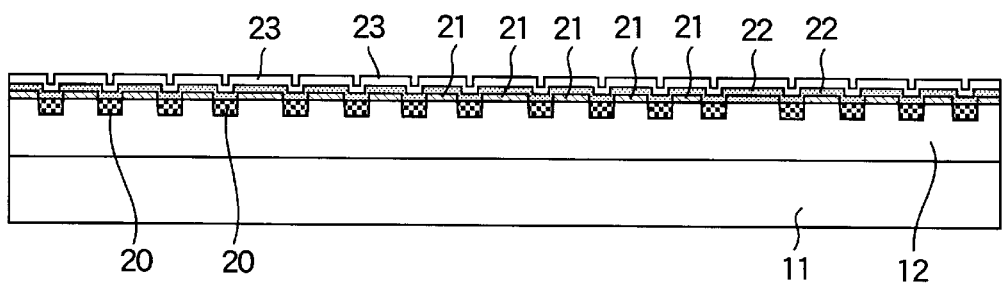
FIG. 7 shows selective diffusion by annealing.

As shown in FIG. 7, the next step is an annealing step that forms the diffusion regions of the first conductive type by selective diffusion of an impurity (e.g., zinc) of the first conductive type from the diffusion source film 22 into the second-conductive-type semiconductor layer 12. About three hours of annealing in a nitrogen atmosphere at 650° C. creates diffusion regions with a diffusion depth of about one micrometer (1 $\mu$m) below the openings 20a in diffusion mask 20. Each diffusion region becomes an LED 20.

Figure 8:
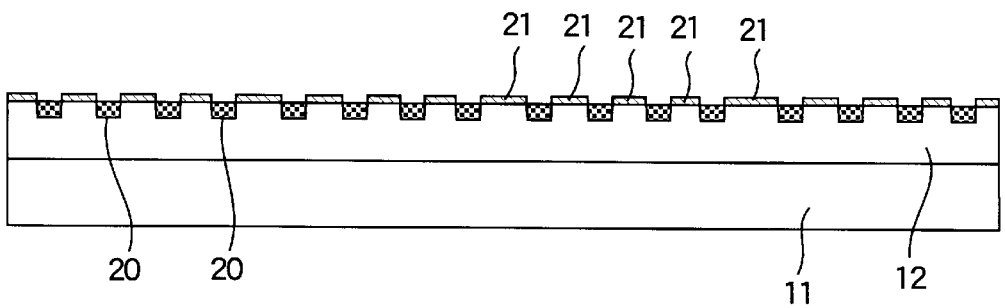
FIG. 8 shows the removal of the anneal cap and diffusion source film.

Next, as shown in FIG. 8, the anneal cap 23 and diffusion source film 22 are removed. The removal can be performed by selective etching.

Figure 9:
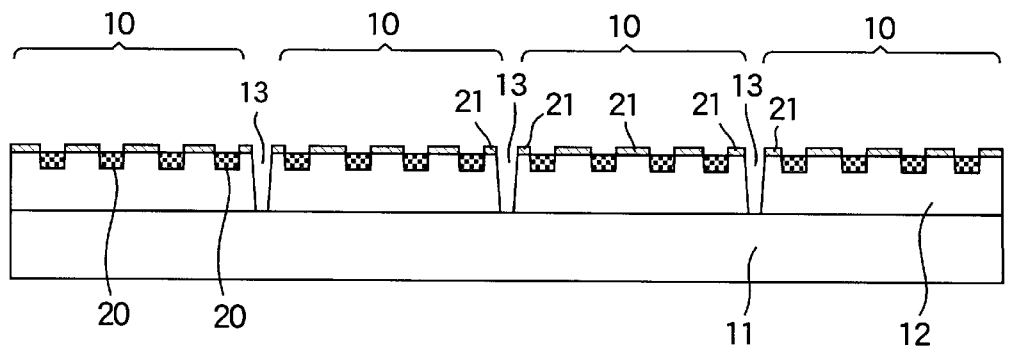
FIG. 9 shows the formation of isolation trenches.

As shown in FIG. 9, in each cell 100, (M−1) isolation trenches 13 are formed with a depth extending to the high-resistance substrate 11, dividing the second-conductive-type semiconductor layer 12 in the cell 100 into M blocks 10. Isolation trenches 13 are also formed between the cells 100. The isolation trenches can be formed by selectively etching the second-conductive-type semiconductor layer 12, using an aqueous phosphoric acid solution as an etchant.

Figure 10:
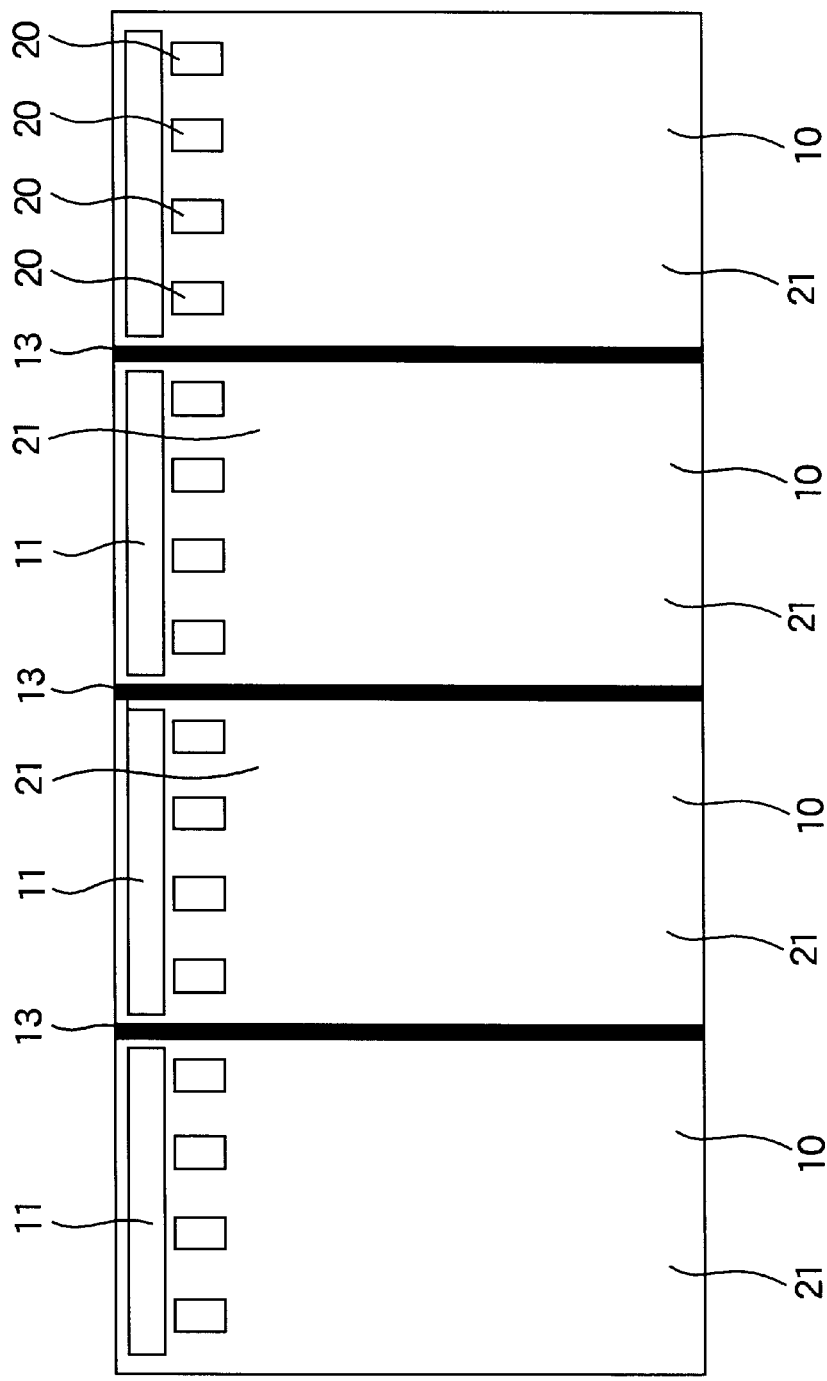
FIG. 10 shows the patterning of the diffusion mask.

Next, as shown in FIG. 10, the diffusion mask 21 is removed from regions extending parallel to and adjacent to the LEDs 20. The removal can be performed by photolithography and etching.

Figure 11:
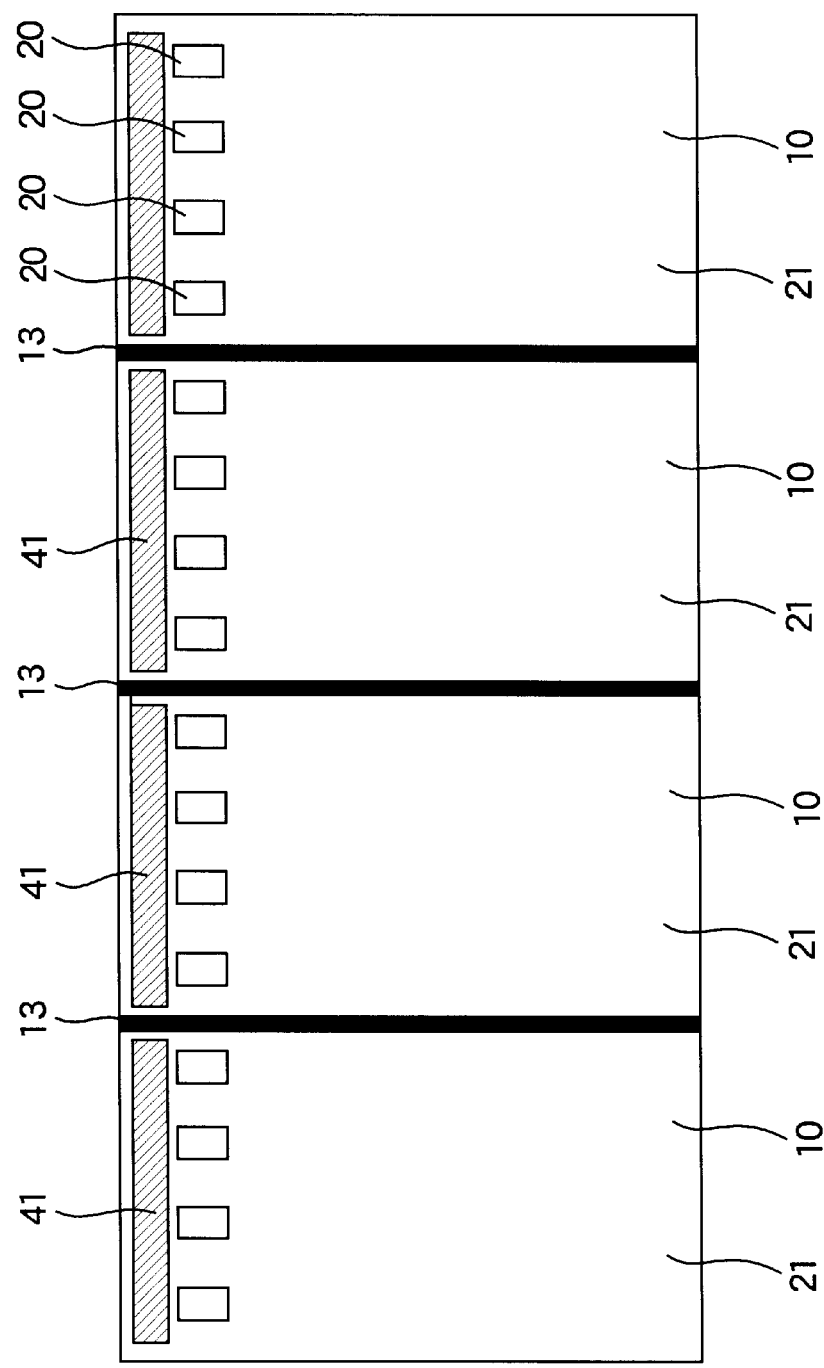
FIG. 11 shows the formation of n-electrodes.

Next, as shown in FIG. 11, n-electrodes 41 are formed in these regions extending parallel to and adjacent the LEDs 20. The n-electrodes 41 may be formed by depositing a film of electrode material and patterning it by the lift-off method. The n-electrodes 41 make electrical contact with the second-conductive-type semiconductor layer 12.

Figure 12:
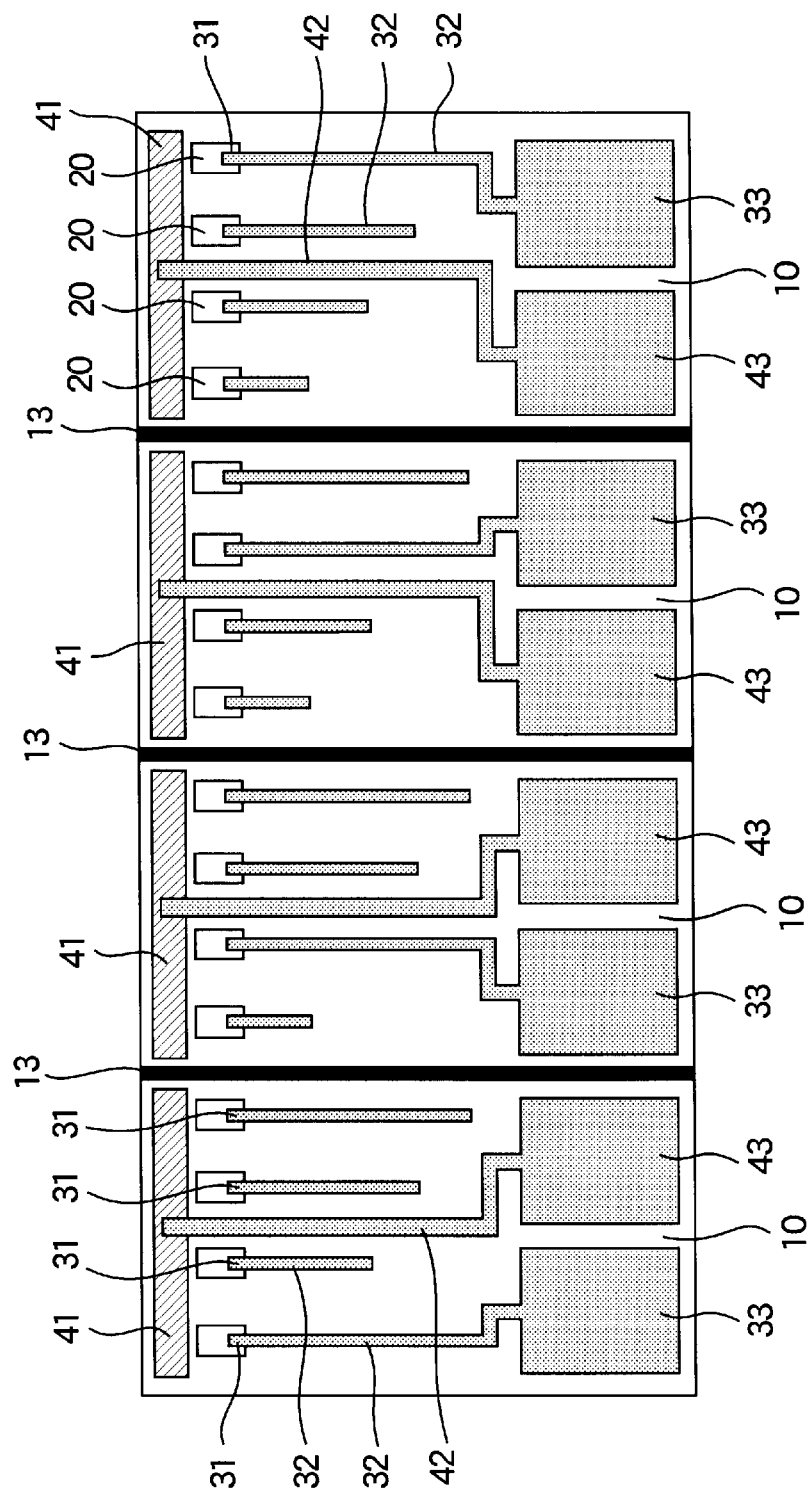
FIG. 12 shows the formation of p-electrodes, electrode pads, and wiring.

Next, as shown in FIG. 12, the p-electrodes 31, p-wires 32, p-electrode pads 33, n-wires 42, and n-electrode pads 43 are formed. Each p-electrode 31 is integrally joined with one of the p-wires 32, and one p-wire 32 in each block 10 is integrally joined with the p-electrode pad 33 in the block.

Similarly, the n-wire 42 in each block 10 is integrally joined with the n-electrode pad 43 in the block. These wiring patterns can also be formed by, for example, the lift-off method.

Figure 13:
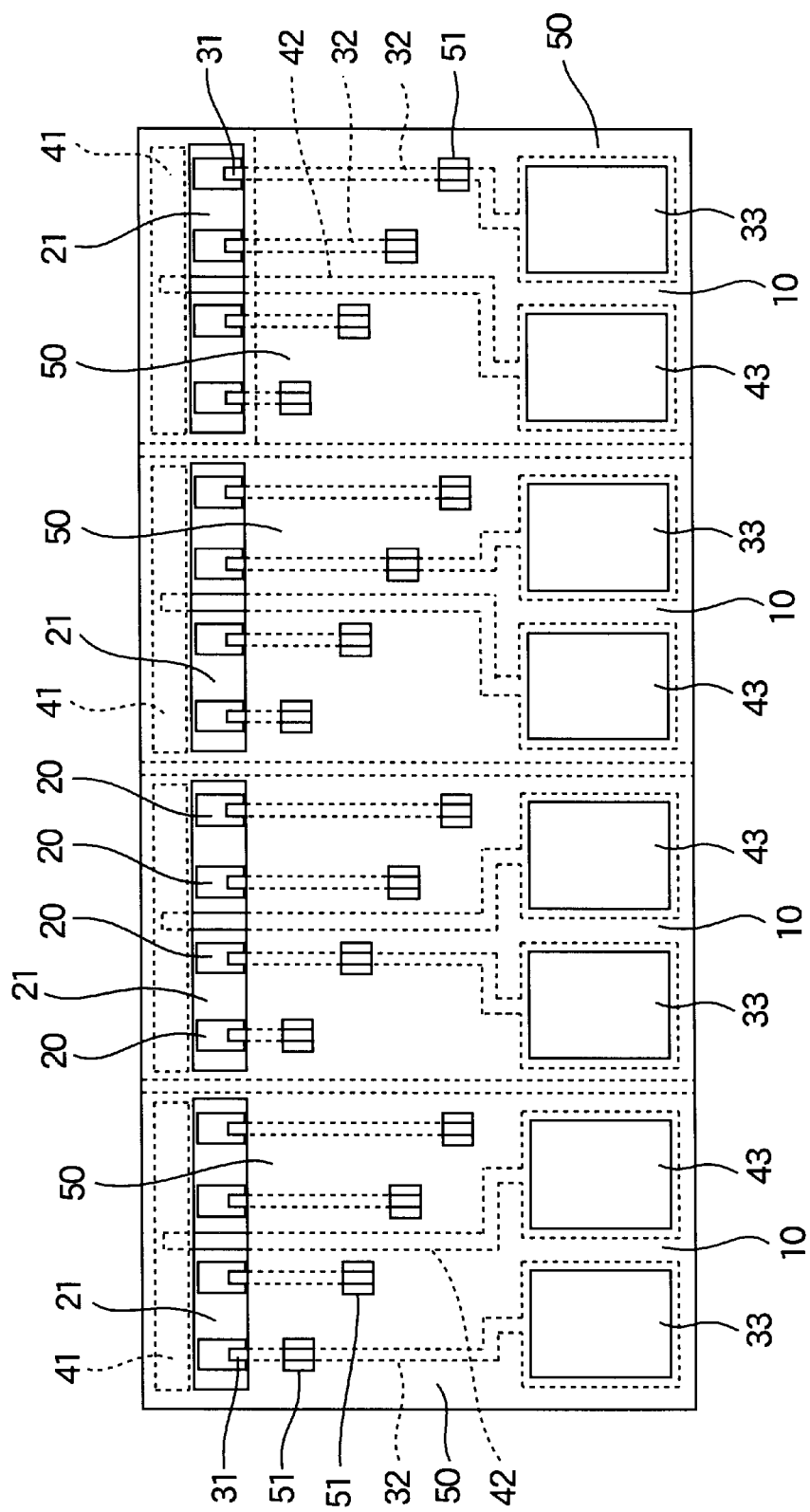
FIG. 13 shows the formation of an inter-layer dielectric film.

Next, as shown in FIG. 13, the inter-layer dielectric film 50 is formed. Openings are formed in the inter-layer dielectric film 50 to provide contact holes 51 above the p-wires 32, windows above the LEDs 20, and windows above the p-electrode pads 33. The openings in the inter-layer dielectric film 50 can be formed by photolithography and etching.

Figure 14:
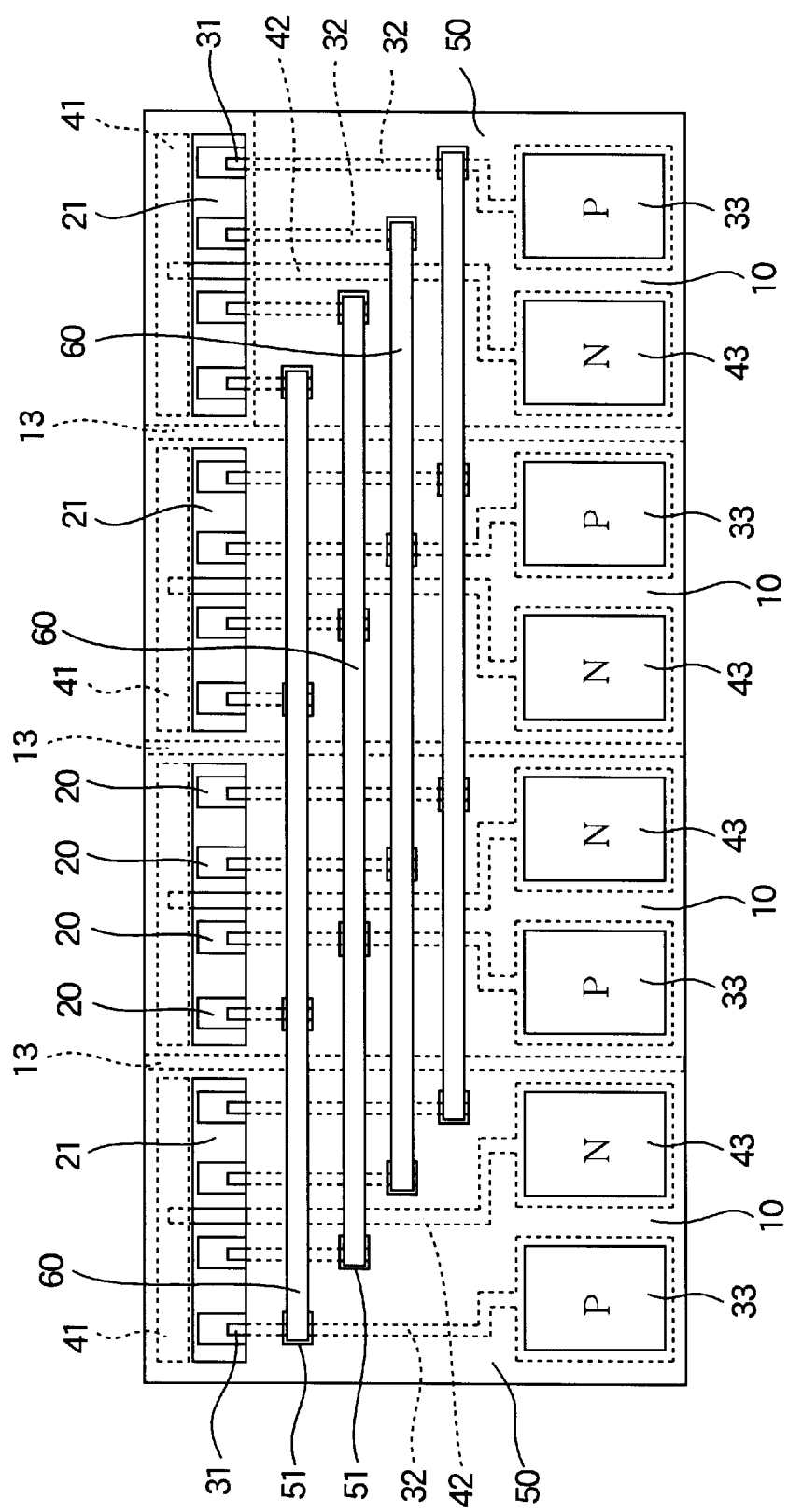
FIG. 14 shows the formation of common wires.

Next, as shown in FIG. 14, N common wires 60 are formed in each cell 100. Each common wire 60 is electrically connected through M contact holes 51 to one p-wire 32, corresponding to one LED 20, in each of the M blocks 10. The wiring pattern of the common wires 60 can also be formed by the lift-off method, for example.

The steps in FIGS. 10 to 12 are not limited to the sequence shown. For example, these steps can be divided as follows: (A) formation of the p-electrodes 31, p-wires 32, and p-electrode pads 33; (B) patterning of the diffusion mask 20 to form windows for the n-electrodes 33; (C) formation of the n-electrodes 41, n-wires 42, and n-electrode pads 43. Steps A, B, and C can then be performed in the sequence A-B-C, B-A-C, or B-C-A.

Second Embodiment

Figure 15:
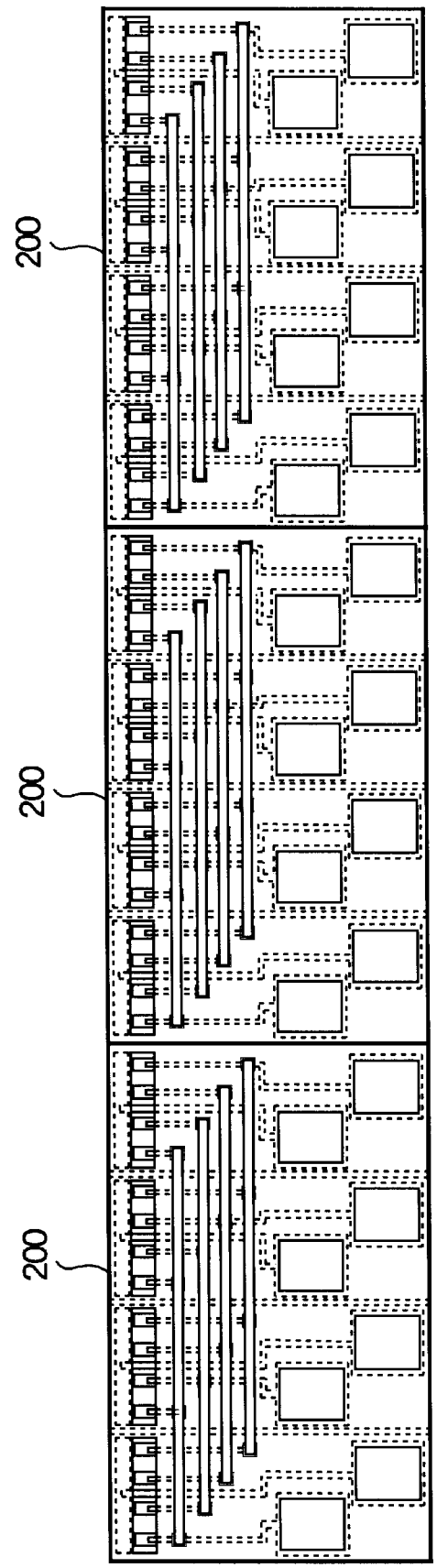
FIG. 15 shows a conceptual plan view of an LED array according to a second embodiment of the invention.
Figure 16:
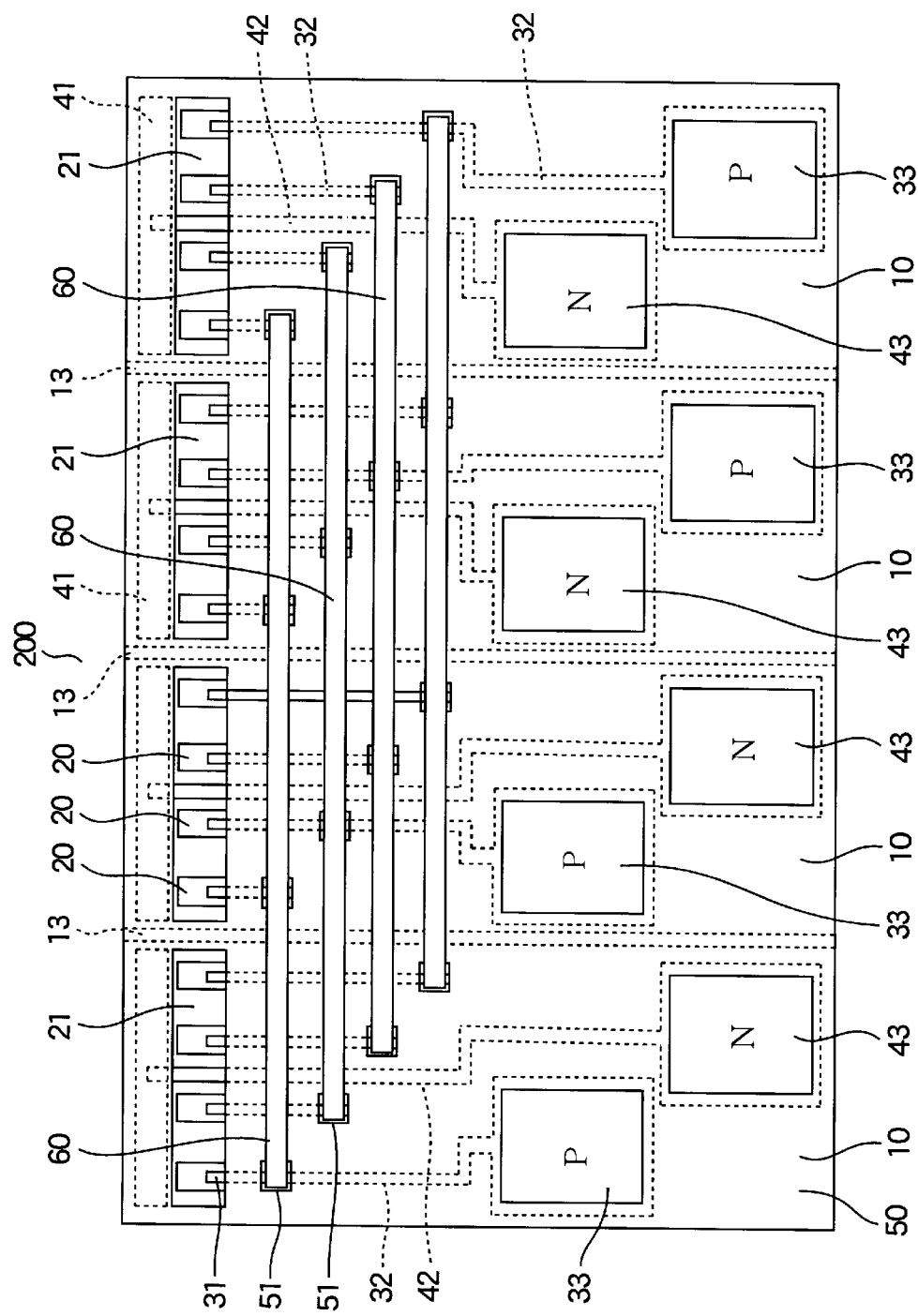
FIG. 16 shows the structure of a cell in FIG. 15.
Figure 17:
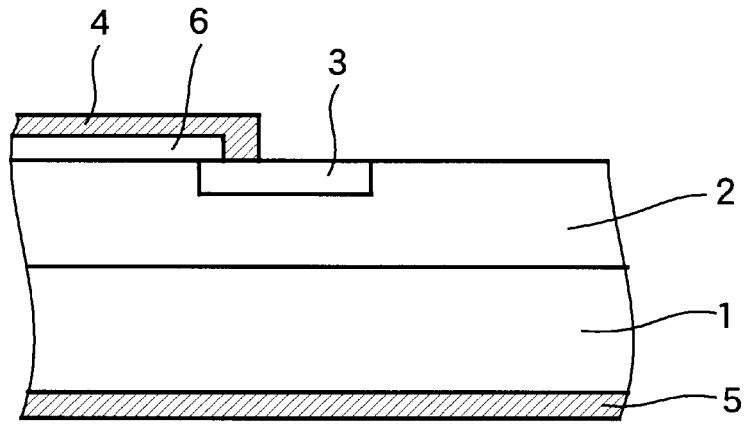
FIG. 17 shows a sectional view of a conventional LED array.
Figure 18:
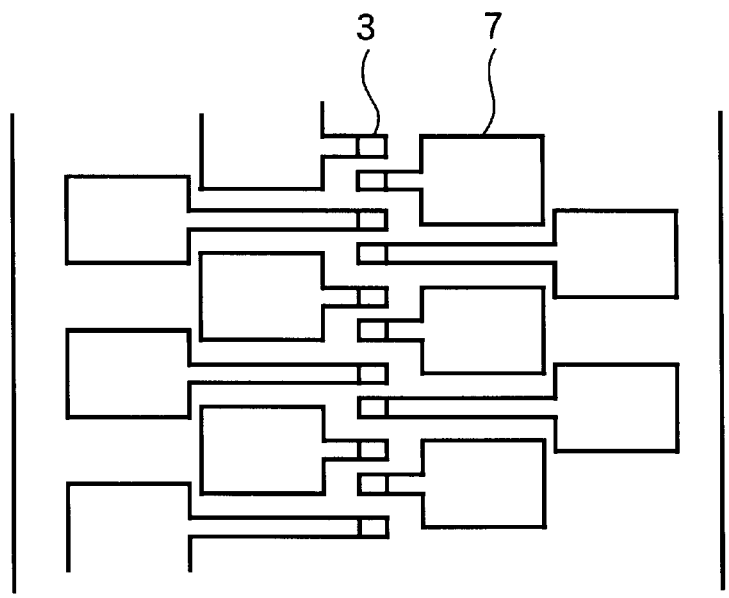
FIG. 18 shows a top plan view of a conventional LED array.
Figure 19:
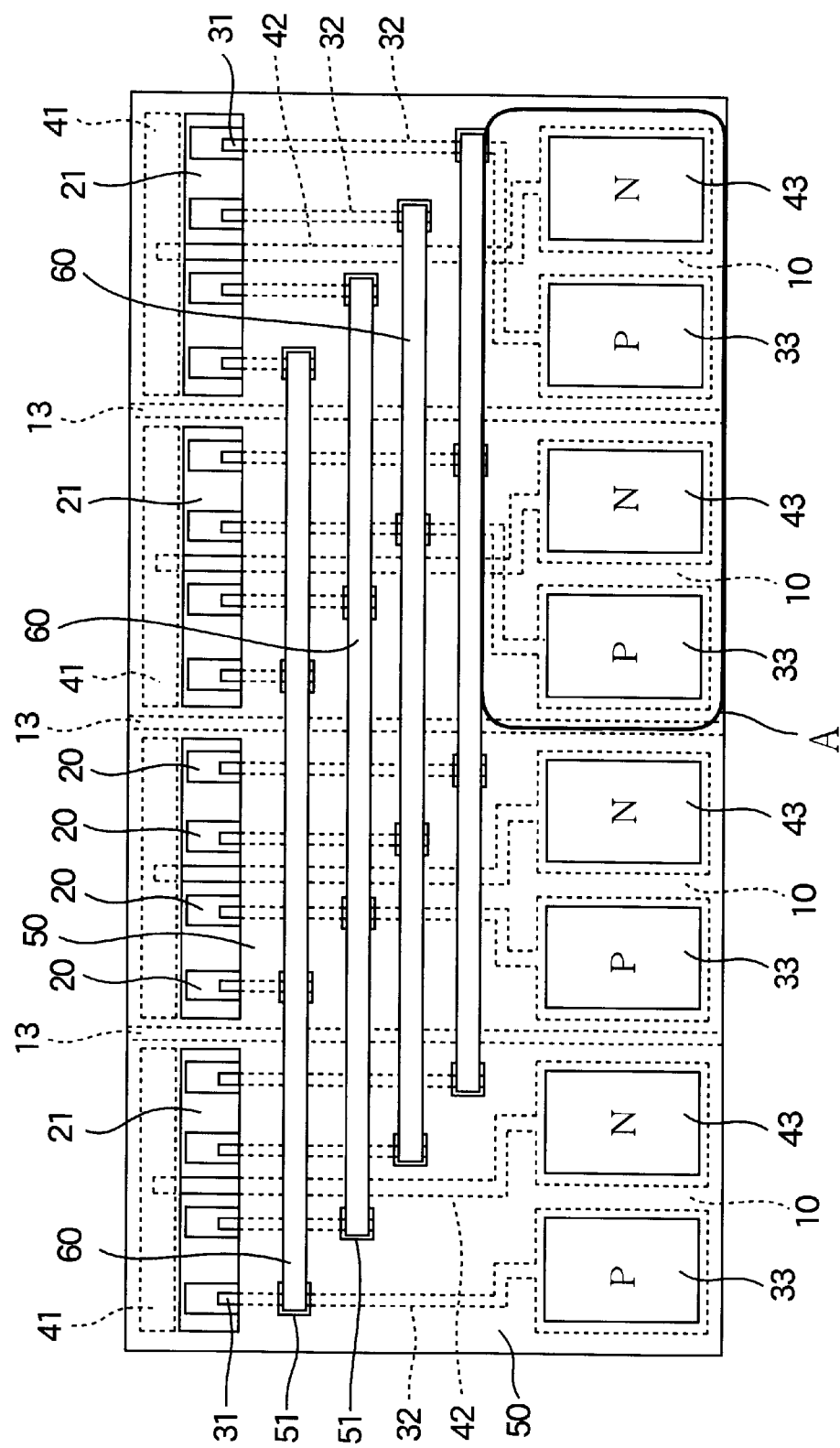
FIG. 19 shows the structure of a cell in a conventional LED array of the multilayer-wiring type.
Figure 20:
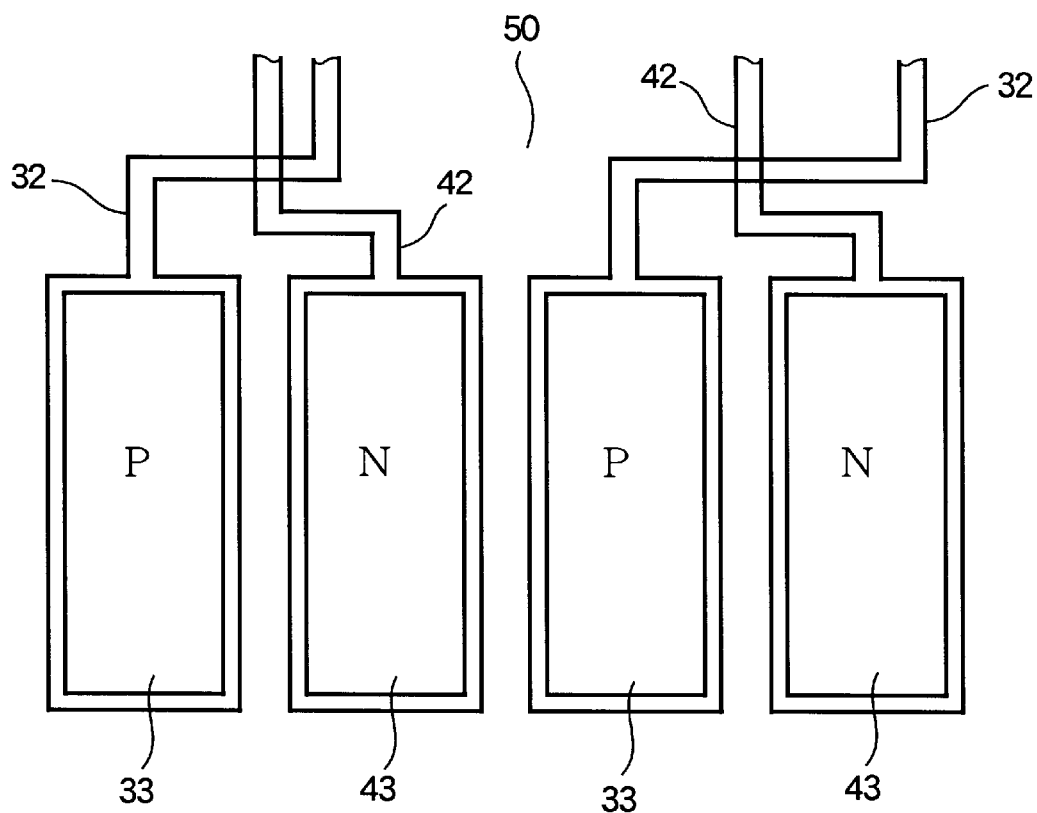
FIG. 20 shows an enlarged view of part A in FIG. 19.

FIG. 15 is a conceptual plan view of an LED array according to the second embodiment of the present invention. FIG. 16 shows the structure of one cell in FIG. 15. As shown in FIGS. 15 and 16, the arrangement of the p-electrode pads 33 and n-electrode pads 43 in each cell 200 in the LED array of the second embodiment differs from that in the first embodiment.

In the second embodiment, as in the first embodiment, p-electrode pads 33 alternate with n-electrode pads 43 on each side of the center of the cell 200, and the pad arrangement is symmetric with respect to the center. However, whereas the p-electrode pads 33 and n-electrode pads 43 of the first embodiment were arranged in a single longitudinal row, the p-electrode pads 33 and the n-electrode pads 43 of the second embodiment are arranged in two longitudinal rows. This enables the p-electrode pads 33 and n-electrode pads 43 in the second embodiment to be larger than in the first embodiment. The enlarged pad size leads to improved reliability of the wire bonding process.

The symmetry relation in the second embodiment is a rotational symmetry rather than a mirror symmetry. Specifically, in the left half of the cell 200, the p-electrode pads 33 are disposed in the row closer to the common wires 60; in the right half of the cell 200, the n-electrode pads 33 are disposed in this row. This arrangement enables a maximum separation of the points of bonding-wire attachment to be maintained throughout the cell, including the two n-electrode pads 43 at the center of the cell.

In the above embodiments, each cell in the array of light-emitting elements can be considered to be divided in the center into two halves, each half including a plurality of first electrode pads and a plurality of second electrode pads, with first wires leading from the first electrode pads to light-emitting elements in different positions in different blocks, and second wires leading from the second electrode pads to second electrodes disposed adjacent to the light-emitting elements. In each half of the cell, the first electrode pads and second electrode pads are arranged alternately, and the arrangement of the electrode pads in one of the two halves of the cell is symmetrically identical to the arrangement of the electrode pads in the other one of the two halves. Consequently, the second wires can be centrally located in each block, so as to make contact with the center of the second electrodes, and the first wires can reach the appropriate light-emitting elements without crossing the second wires. As explained above, this arrangement prevents wiring failures at crossover points, leading to improved reliability of the LED array, and enables the first electrode pads, second electrode pads, first wires, and second wires to be formed simultaneously from the same material, which facilitates the manufacturing process.

A few variations have been noted in the embodiments above, but those skilled in the art will recognize that further variations are possible within the scope of the appended claims.

What is claimed is:

1. An array of light-emitting elements having a substrate with a semiconductor layer, a first dielectric layer formed on the semiconductor layer, and a second dielectric layer formed on the first dielectric layer, the first dielectric layer and the second dielectric layer having respective openings, the array being divided into a plurality of blocks that are electrically isolated by isolation trenches formed in the semiconductor layer, the blocks constituting one or more cells, each block having:
a row of light-emitting elements formed in the semiconductor layer by selective diffusion of an impurity;
a plurality of first electrodes formed on the first dielectric layer, electrically connected to the light-emitting elements through openings in the first dielectric layer;
a plurality of first wires formed on the first dielectric layer, electrically connected to respective first electrodes;
a first electrode pad formed on the first dielectric layer, electrically connected to one of the first wires, thus to one of the first electrodes;
a second electrode formed on the semiconductor layer adjacent the row of light-emitting elements;
a second wire formed on the first dielectric layer, electrically connected to the second electrode through an opening in the first dielectric layer, the second wire being wholly disposed to one side of said one of the first wires; and
a second electrode pad formed on the first dielectric layer, electrically connected to the second wire;

each cell having:
a plurality of common wires formed on the second dielectric layer, the number of common wires being equal to the number of light-emitting elements per block, each first wire in each block being electrically connected through an opening in the second dielectric layer to one of the common wires;
wherein relative positions of the first electrode pad and the second electrode pad are varied in different blocks in the cell, enabling the first wires connected to the first electrode pads to be electrically connected to light-emitting elements in different positions in different blocks without crossing the second wires.

2. The array of light-emitting elements of claim 1, wherein the first electrodes, the first wires, the first electrode pads, the second wires, and the second electrode pads are formed from the same material.

3. The array of light-emitting elements of claim 1, wherein the array of light-emitting elements extends in a longitudinal direction and the first electrode pads and the second electrode pads in each cell are disposed in a single row parallel to the longitudinal direction.

4. The array of light-emitting elements of claim 1, wherein the array of light-emitting elements extends in a longitudinal direction and the first electrode pads and the second electrode pads in each cell are disposed in two rows parallel to the longitudinal direction.

5. The array of light-emitting elements of claim 1, wherein the cell is divided into two halves with mutually symmetric arrangements of the first and second electrode pads.

6. The array of light-emitting elements of claim 5, wherein said mutually symmetric arrangements are mutually mirror-symmetric.

7. The array of light-emitting elements of claim 5, wherein the first electrode pads alternate with the second electrode pads in each one of the two halves.

8. The array of light-emitting elements of claim 1, wherein the second wire in each said block is centrally located in the block.

9. An array of light-emitting elements, the array being divided into electrically isolated blocks linked by common wiring, each block including:
   a row of light-emitting elements;
   an electrode disposed adjacent and parallel to the row of light-emitting elements;
   a first pad for attachment of a bonding wire;
   a first wire electrically connecting the first pad to one of the light-emitting elements in the block;
   a second pad for attachment of another bonding wire; and
   a second wire electrically connecting the second pad to said electrode;
   wherein the rows of light-emitting elements in the blocks are mutually aligned to form a single row of light-emitting elements having a first end and a second end; and
   the blocks are divided into a first group of blocks in which the first pad and the first wire are closer than the second pad and the second wire to the first end, and a second group of blocks in which the second pad and the second wire are closer than the first pad and the first wire to the first end.

10. The array of light-emitting elements of claim 9, having a first wiring layer including the first pad, the first wire, the second pad, and the second wire in each block, and a second wiring layer including the common wiring.

11. The array of light-emitting elements of claim 10, wherein the first pad, the first wire, the second pad, and the second wire in each block have mutually identical material compositions.

12. The array of light-emitting elements of claim 9, wherein the array is divided into a plurality of cells, each cell including at least one block belonging to the first group and at least one block belonging to the second group, the common wiring linking the blocks within each cell.

13. The array of light-emitting elements of claim 12, wherein each cell has a center, only blocks belonging to the first group are disposed on one side of the center, and only blocks belonging to the second group are disposed on another side of the center.

14. The array of light-emitting elements of claim 13, wherein the first pads and second pads are aligned in a single row.

15. The array of light-emitting elements of claim 13, wherein:
   the first pads are aligned in a first row on said one side of the center, and in a second row on said another side of the center; and
   the second pads are aligned in the second row on said one side of the center, and in the first row on said another side of the center.

* * * * *